(12) United States Patent
Patterson et al.

(10) Patent No.: US 6,587,492 B2
(45) Date of Patent: Jul. 1, 2003

(54) BIPOLAR CASCADE ARROW LASER

(75) Inventors: Steven G. Patterson, Stevenson Ranch, CA (US); Rajeev J. Ram, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 26 days.

(21) Appl. No.: 09/797,188

(22) Filed: Mar. 1, 2001

(65) Prior Publication Data

US 2001/0043628 A1 Nov. 22, 2001

Related U.S. Application Data

(60) Provisional application No. 60/186,865, filed on Mar. 3, 2000.

(51) Int. Cl.[7] .............................................. H01S 5/00
(52) U.S. Cl. ............................................ 372/43; 372/46
(58) Field of Search ............................. 372/43, 46, 45, 372/50

(56) References Cited

U.S. PATENT DOCUMENTS

| | | |
|---|---|---|
| 5,054,871 A | 10/1991 | Deri et al. |
| 5,193,131 A | 3/1993 | Bruno |
| 5,715,266 A | 2/1998 | Takagi |
| 6,167,073 A * | 12/2000 | Botez et al. ............... 372/46 |
| 6,219,365 B1 * | 4/2001 | Mawst et al. .............. 372/46 |

FOREIGN PATENT DOCUMENTS

FR   2 761 537 A1   10/1998

OTHER PUBLICATIONS

H.C. Casey, Jr. and M.B. Panish Heterostructure Lasers (pp. 24–32).*

* cited by examiner

*Primary Examiner*—Paul Ip
*Assistant Examiner*—Leith Al-Nazer
(74) *Attorney, Agent, or Firm*—Daly, Crowley & Mofford, LLP

(57) ABSTRACT

A bipolar cascade-ARROW laser includes a plurality of core regions, at least one spacer disposed between each the plurality of core regions with each of the at least one spacers provided from a material having an index of refraction which is higher than an index of refraction of a material from which the core regions are provided. The bipolar cascade-ARROW laser further includes an anti-reflector disposed against each of the outermost ones of the core regions and at least one quantum well disposed in each of the plurality of core regions.

20 Claims, 3 Drawing Sheets

BIPOLAR CASCADE ARROW LASER

CROSS-REFERENCE TO RELATED APPLICATIONS

This application claims priority from U.S. Provisional Patent Application No. 60/186,865 filed on Mar. 3, 2000, which is incorporated herein by reference.

STATEMENTS REGARDING FEDERALLY SPONSORED RESEARCH

This work was sponsored by the Department of the Air Force, Air Force Research Laboratory contract number F30602-99-1-0501. The government may have certain rights in this invention.

FIELD OF THE INVENTION

This invention relates generally to lasers, and more particularly, to cascaded lasers.

BACKGROUND OF THE INVENTION

As is known in the art, a laser is a device that produces optical radiation using a population inversion to provide Light Amplifcation by Stimulated Emission of Radiation and, generally, an optical resonant cavity to provide positive feedback. An injection laser diode (ILD) or more simply a diode laser, is a laser employing a forward-biased semiconductor junction for the active medium.

As is also known, series-coupled diode lasers are capable of producing RF link gain, while retaining voltage, incremental resistance, and slope efficiency properties that are the sum of the individual lasers. Both series and in-line arrays of discrete devices have parasitic capacitance and inductance resulting from interconnections between the devices. These parasitic effects limit the performance of the array. The series devices suffer the further problem of being difficult to couple into fiber. A solution to both problems is to series couple separate laser structures through Esaki or back diodes during the epitaxial process. This type of device is known as a bipolar cascade laser (BCL).

Ideally, the BCL operates by having each injected electron participate in a recombination event in the topmost laser junction then tunnel from the valence band of the first junction into the conduction band of the next junction, participate in another recombination event, and so on through each stage of the cascade. This is illustrated in FIGS. 1 and 1A. In this way the quantum wells (QW) of the laser junctions are coupled in series, as opposed to the parallel filling of conventional multi-QW devices. For N cascaded gain sections each injected electron can produce up to N photons. This cascading effect is the source of the improved differential slope efficiency cascade lasers enjoy over conventional (parallel coupled) multiple quantum well lasers. Since each injected electron produces several photons, the bipolar cascade laser provides signal gain.

Conventional edge-emitting bipolar cascade lasers have been of two varieties. In the first, the cascaded gain sections and tunnel junctions have been placed inside of a single dielectric waveguide. This structure has the advantage of increasing the overlap of the field with the active regions (known as $\Gamma$) thereby ideally reducing the threshold current of the device approximately proportionally to the number of cascaded active regions. The inclusion of the highly doped, and hence highly absorbing, tunnel junctions in the waveguiding region also substantially increases optical loss for the fundamental mode, negating part or all of the increase in $\Gamma$.

An alternative design is to have separate active/waveguiding regions, as in traditional edge-emitting designs, each coupled electrically during the epitaxial process via a tunnel junction (FIG. 1). While no improvement in $\Gamma$ is realized with this approach, the optical absorption losses are minimally effected by the presence of the tunnel junction. One problem with this approach, however, is that the separate waveguide design lies in its generated beam profile. The preferred lasing mode is "odd." That, is the field in each waveguide is 180 degrees out of phase with the adjacent waveguides. The result of this excitation is a beam profile with an on-axis null which prevents efficient coupling into single-mode optical fiber.

An "even" field mode (i.e. a mode in which the field in each waveguide is in-phase with the adjacent waveguides) can be generated by increasing the distance between the waveguides (thereby decoupling them). Such a large separation, however, further exacerbates efficient single-mode coupling. While the series coupling of the active regions is preferably accomplished electrically, it is desirable to electromagnetically couple the waveguides in parallel.

As is also known, optical waveguiding in diode lasers is normally achieved by sandwiching a first dielectric material having a first optical index of refraction between two "cladding" layers of dielectric material. Each of the cladding layers are provided having an optical index of refraction which is lower than the index of refraction of the first dielectric material. Light incident upon the interface from the high index side at angles greater than the critical angle results in total power reflection. By placing an active gain material, e.g. a quantum well, in the high index region a large overlap is achieved between the optical field and the active region, resulting in stimulated emission or "lasing."

A similar problem with an on-axis farfield null, as described above, has been encountered in the field of high-power diode laser arrays. To circumvent this problem, an anti-reflecting resonant optical waveguiding (ARROW) structure can be used. In this design, the active regions are placed inside the low optical index material. Normally this would cause the optical fields generated by the active medium to be scattered. By proper selection of the dimensions of the high and low index regions of the anti-guide the lateral component of the field is made to resonate, however. In this way the entire structure acts as a single waveguide. The inclusion of a pair of appropriately dimensioned anti-reflectors at either end of the resonant structure ensures the fields inside the lateral resonator retain the proper phase relationship for emitting most of the optical power into a single on-axis farfield lobe.

When employed in a high-power diode laser array, the ARROW guiding structure was implemented in the lateral direction through multiple processing steps and epitaxial regrowth. The use of standard semiconductor processing techniques limits the minimum achievable dimensions and index contrast. Using epitaxial growth techniques, the ARROW can be implemented in the vertical direction. The advantages of epitaxy also include monolayer control over the device dimensions afforded by modern growth technologies such as MBE and MOCVD. Further, varying index contrasts can be achieved by using the full range of lattice matched ternary and quaternary materials achievable through MBE and MOCVD. The ability to precisely control the optical index, active region properties, and dimensions in each section of the ARROW independently during the epitaxial growth process permits the output near and farfield patterns to be tailored to specific application needs.

Aside from the beam profile and implementation disadvantages inherent in the lateral ARROW, an additional disadvantage arises in that individual active regions must be electrically driven in parallel.

It would, therefore, be desirable to provide a device which allows transmission of signals having a relatively high signal to noise ratio over an optical fiber.

SUMMARY OF THE INVENTION

In accordance with the present invention, a bipolar cascade-ARROW laser includes a bipolar cascade laser and an anti-resonant reflecting optical waveguide (ARROW). The bipolar cascade laser electrically couples multiple active regions during the epitaxial process via highly doped p-n junctions known as tunnel junctions. The ARROW is a means of electromagnetically parallel-coupling multiple active sections, while minimizing lateral radiation loss. With this particular arrangement, a laser which allows transmission of signals having a relatively high signal-to-noise ratio transmission over optical fiber is provided. The electrical coupling of the active regions inside a single active region results in the laser of the present invention having reduced noise and improved SNR. Unlike conventional semiconductor lasers, in the laser of the present invention multiple photons are generated for every injected electron. This enables the laser of the present invention to produce higher signal levels without a commensurate increase in noise. Furthermore, unlike existing approaches to cascade lasers, the laser of the present invention emits light at wavelengths suitable for long distance fiber optic transmission with a beam profile that is compatible with efficient coupling into optical fiber. Thus, the device is suitable for communication and other applications.

Furthermore, the optical loss introduced by the highly doped tunnel junctions serves the useful purpose of improving mode discrimination between the desired fundamental optical mode and higher order optical modes rather than interfering with the operation of the bipolar cascade-ARROW laser. Moreover, use of an electrical cascade via highly doped tunnel junctions to obtain differential quantum efficiencies in excess of 100% while use of an ARROW structure permits optical coupling of multiple active regions. A further advantage is that the BCL ARROW laser of the present invention has a diffraction limited optical beam of narrow divergence angle as a result of the optical coupling of the low index active regions.

Since the bipolar cascade-ARROW laser can be realized in many material systems, such as the alloys of In, Ga, As, P, Al, N, Sb, and in virtually all present configurations including but not limited to Fabry-Perot, distributed feedback, distributed Bragg reflectors, alpha and vertical cavity surface emitting lasers, it can be used in analog and digital communications applications, as well as in medical applications. Furthermore the laser of the present invention finds use in any application which requires high power and/or high power array applications. The bipolar cascade-ARROW laser of the present invention is also superior to other diode lasers in that the output beam couples more efficiently into optical fiber, the noise is lower, the electrical to optical conversion is more efficient, and the highly absorbing regions of the device improve, rather than diminish, performance (i.e. the optical loss introduced by the highly doped tunnel junctions serves the useful purpose of improving mode discrimination between the desired fundamental optical mode and higher order optical modes). Thus, as listed above, the bipolar cascade-ARROW laser of the present invention embodies superior performance over conventional lasers in many important performance criteria.

In summary, the use of the bipolar cascade laser in combination with the vertical ARROW structure enables the ARROW laser (or the bipolar cascade-ARROW laser) to be implemented vertically during the epitaxial process. Previous versions of ARROW lasers have been implemented laterally by using areas of regrowth to introduce the necessary index variation, with the active regions being electrically pumped in parallel. Combining the BCL-ARROW laser with the prior art of lateral ARROW lasers leads to full two dimensional arraying.

The advantages and improvements of the bipolar cascade-ARROW laser over conventional devices includes: (1) use of an electrical cascade via highly doped tunnel junctions to obtain differential quantum efficiencies in excess of 100%; (2) use of an ARROW structure to permit optical coupling of multiple active regions; (3) a device having a diffraction limited optical beam of narrow divergence angle; (4) a device having reduced noise and improved SNR resultant from electrical coupling of the active regions inside a single active region; and (5) a device in which the optical loss introduced by the highly doped tunnel junctions serves the useful purpose of improving mode discrimination between the desired fundamental optical mode and higher order optical modes rather than interfering with the operation of the bipolar cascade-ARROW laser.

BRIEF DESCRIPTION OF THE DRAWINGS

The foregoing features of this invention, as well as the invention itself, may be more fully understood from the following description of the drawings in which.

DETAILED DESCRIPTION OF THE INVENTION

In the description hereinbelow, reference is sometimes made to a BCL-ARROW laser fabricated using a particular material system or a particular processing technique. Those of ordinary skill in the art will appreciate, of course, that the concepts described herein apply equally well to BCL-ARROW lasers fabricated using any appropriately selected material system and any processing technique which results in the fabrication of a suitable BCL-ARROW laser structure. Reference is also sometimes made herein to use of the BCL-ARROW laser in a particular application. Those of ordinary skill in the art will appreciate that the BCL-ARROW laser finds use in a variety of applications and that those presented herein are only examples and should not be construed as limiting.

Figure 1A:
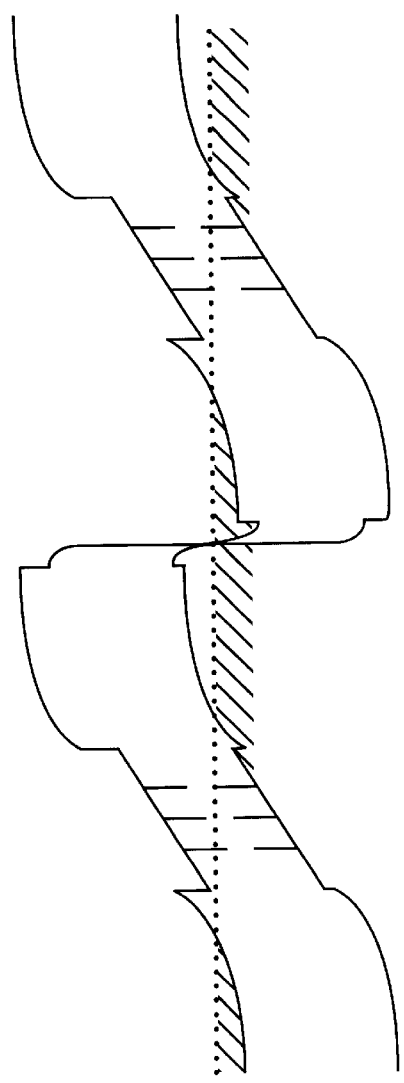
FIG. 1A is a diagram of bipolar cascade laser band structure.
Figure 1B:
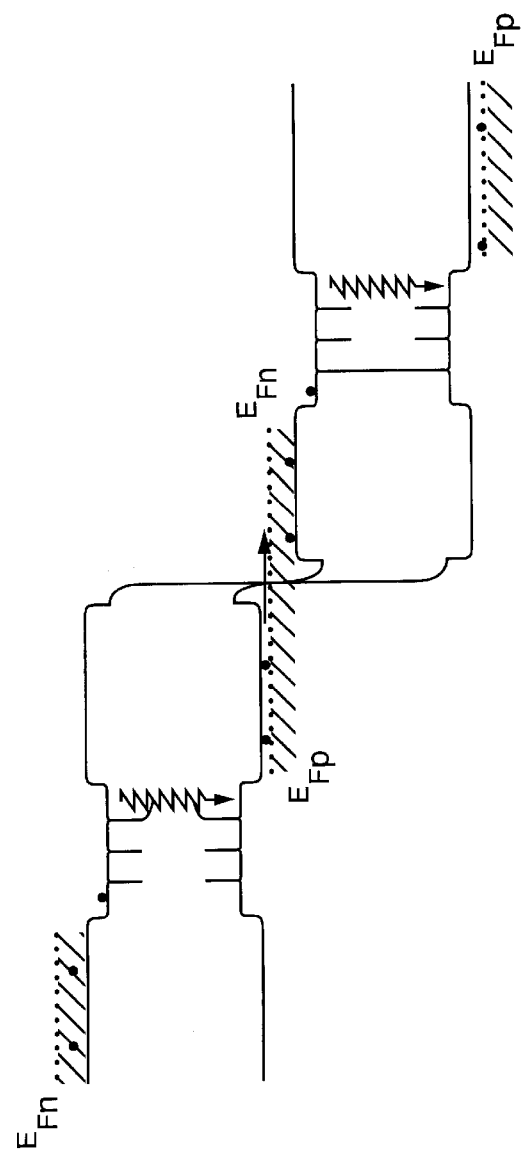
FIG. 1B is diagram of a bipolar cascade laser band structure biased to flatband.
Figure 2:
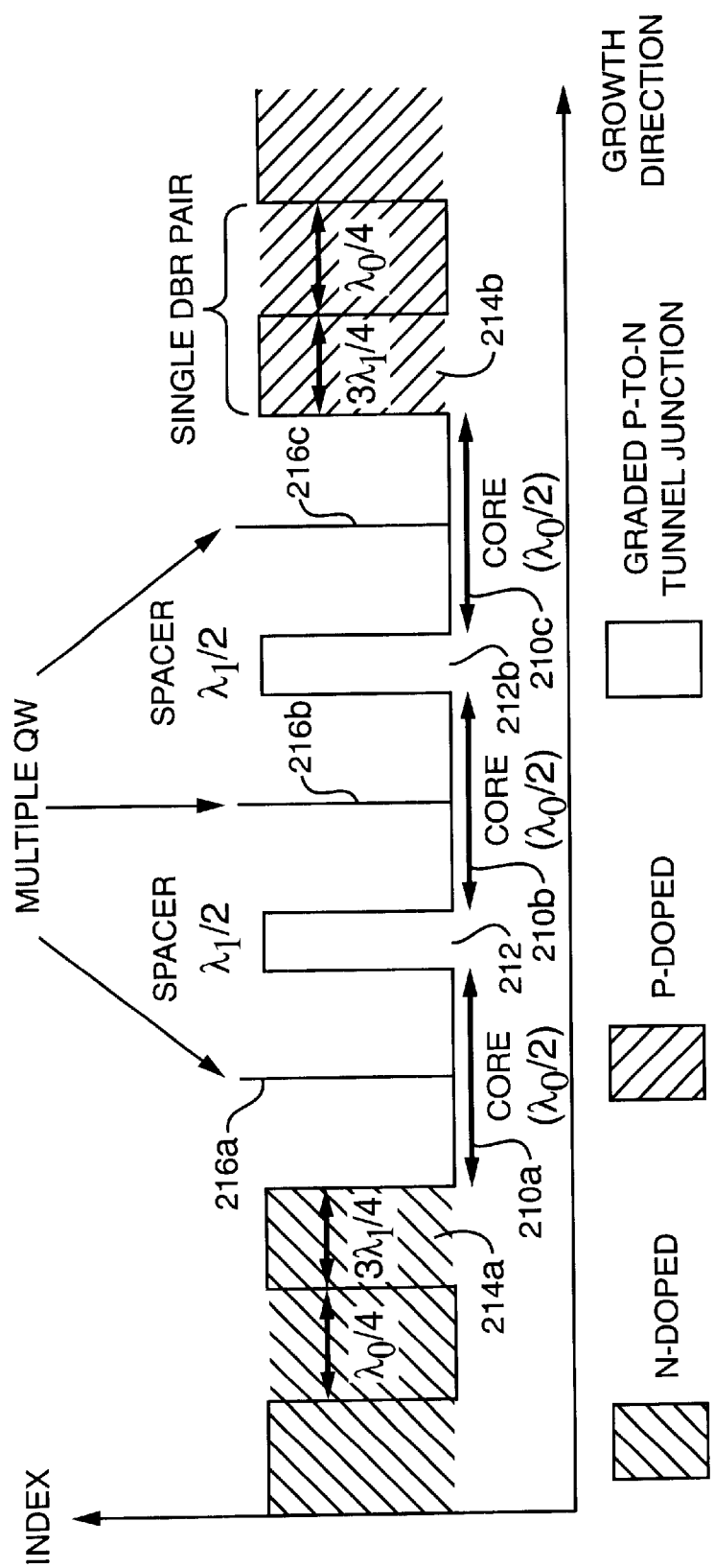
FIG. 2 is diagram of a structure of one possible implementation of a bipolar cascade-ARROW laser in accordance with the present invention.

Referring now to FIG. 2, a bipolar cascade-ARROW laser 200 includes three core regions 210a–210c having spacers 212a, 212b disposed therebetween and a single anti-reflector 214a, 214b on each end of the structure. The core regions 210a–210c are provided from a material having a relatively low index of refraction and the spacer regions 212a, 212b are provided having an index of refraction that is higher than the index of refraction of the core regions 210a–210c. Each of the core regions 210a–210c has a single quantum well (QW) 216a, 216b, 216c.

The bipolar cascade-ARROW laser of the present invention can be realized in variety of materials including alloys of In, Ga, As, P, Al, N, and Sb. The bipolar cascade-ARROW laser can be fabricated in a range of configurations including Fabry-Perot, distributed feedback, distributed Bragg reflectors, alpha and vertical cavity surface emitting lasers. A variety of techniques known to one of ordinary skill in the art can be used to fabricate a bipolar cascade-ARROW laser in accordance with the present invention such as the techniques used to build Fabry-Perot and DFB lasers for example.

In one particular embodiment, the core regions 210 are provided from indium gallium phosherous ($In_{0.49}Ga_{0.51}P$), the spacer regions 212 are provided from gallium arsenide (GaAs) and the quantum wells 216 are provided from $In_{0.2}Ga_{0.8}As$. The spacer regions 212a, 212b provide tunnel junctions between the respective ones of the core regions 210a, 210c.

In one embodiment, each core 210 has a width corresponding to one half of a vertical wavelength in the low index region, e.g., $\lambda_0/2$, and each spacer 212 has a width corresponding to one half of a lateral wavelength in the high index region, e.g., $\lambda_1/2$, making these sections resonant. Each anti-reflector 214 can have a width corresponding to three-fourths of the high index region lateral wavelength, e.g., $3\lambda_1/4$. In an exemplary embodiment, the high index material is GaAs for a lateral wavelength $\lambda_1$ of 0.85 micrometer and the low index material is $In_{0.49}Ga_{0.51}P$ for a lateral wavelength of 1.5 micrometer.

The spacer regions are also the tunnel junctions which electrically couple the core regions. The reflector region closest to the core/spacer regions must be (2m+1) quarter lateral wavelengths (for m an integer) to make the reflected waves such that all core regions are in-phase, with the last quarter lateral wavelength completing one period of a Bragg reflector stack. These points essentially provide the fundamental parameters of the BCL-ARROW, with the section sizes being defined by wavelength in conjunction with the material types chosen such that the optical indices alternate as shown.

It should be noted that FIG. 2 shows a relatively simple embodiment of the invention utilizing a single quantum well in each of three low index core regions, two high index spacers, and a single anti-reflector to either side. In general, more quantum wells per active region, more total core/spacer regions, and several reflector periods may be used. It is understood that the use of additional quantum wells in each active region decreases the threshold carrier density (at the expense of increased threshold current), additional core/spacer regions increase the differential quantum efficiency of the BCL-ARROW (at the expense of increased device heating), and additional reflectors decrease the lateral optical loss (at the expense of increased growth time and complexity and device resistance). One of ordinary skill in the art can readily modify the exemplary structure of FIG. 2 in view of these considerations without departing from the invention.

The index for each core/spacer/anti-reflector may vary from the others as long as the high/low index variation is maintained throughout. The use of the quantum wells in the low index regions has the added benefit of providing a deeper potential well for trapped carriers thereby greatly diminishing thermally induced carrier escape.

Figure 3:
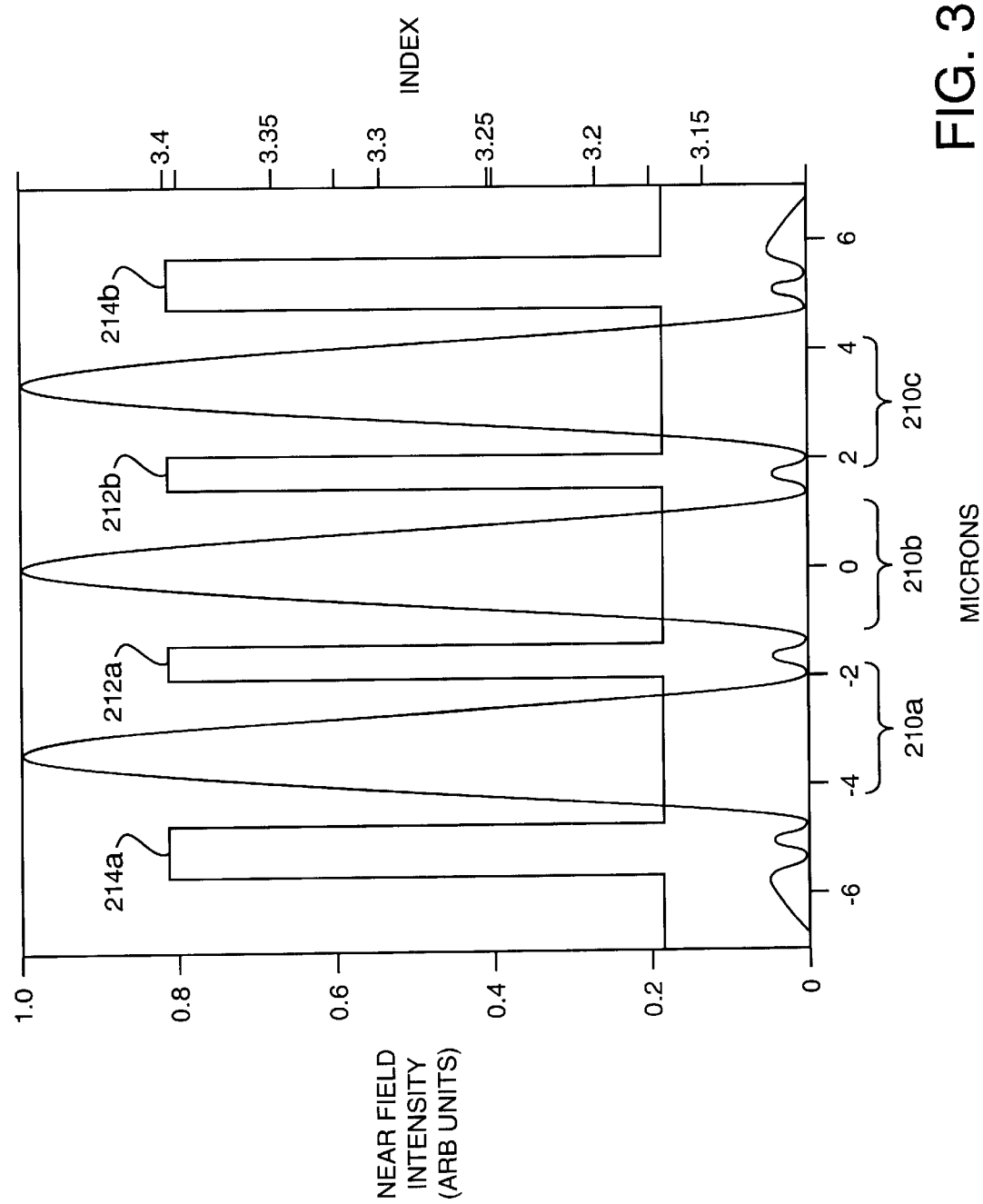
FIG. 3 is a plot of field intensity and index of the bipolar cascade ARROW of FIG. 2.

Referring now to FIG. 3, the optical field intensity and index vs. distance for the bipolar cascade-ARROW of FIG. 2 is shown. As can be seen from an examination of FIG. 3, the quantum wells reside in the low optical index region, unlike conventional diode lasers.

In one particular embodiment adapted for operation at about 1.55 micrometer, a bipolar cascade ARROW laser includes a plurality of core regions composed of InP of vertical wavelength (dimension) equal to approximately 2.8 um. Contained within each core is one or more quantum wells of about 0.8% compressively strained InGaAsP with emission wavelength equal to about 1.55 um. A spacer region between each core region consisting of InGaAsP (bandgap=1.2 um) of vertical wavelength (dimension) equal to approximately 0.3 microns. The spacer regions also contain the tunnel junctions. The laser further includes a reflector comprising InGaAsP (bandgap=1.2 um) of vertical dimension (wavelength) equal to 0.93 um and InP of vertical wavelength (dimension) of 1.5 um.

Aside from the beam profile and implementation disadvantages inherent in a conventional lateral ARROW, an additional disadvantage arises in that individual active regions must be electrically driven in parallel. The use of the bipolar cascade laser in combination with the vertical ARROW structure enables the ARROW laser (or the bipolar cascade-ARROW laser) of the present invention to be implemented vertically during the epitaxial process. When further combined with the just described lateral guiding implementation, full two dimensional arraying is made possible.

High power applications of the non-bipolar cascade ARROW laser of the present invention may require the introduction of additional loss (via optical absorption) in the spacer regions of the ARROW to discriminate against unwanted optical modes. In the bipolar cascade-ARROW laser of the present invention, the same highly doped tunnel junctions necessary for achieving the cascading effect serve the dual role of discriminating against these unwanted optical modes. This is in stark contrast to the prior art laser designs described above in which the quantum wells and tunnel junctions are all placed into a single guiding layer leading to optical loss with an adverse effect on device performance.

One important figure of merit for any information transmission application is the signal-to-noise ratio (SNR). As described above, the cascading process of the present invention results in signal gain. The signal in each active region is the same as all others to the electrical coupling, i.e. they are correlated to one another, while the noise processes in each active region are independent of the others, leading to improved signal-to-noise ratio. The signal gain and noise reduction provided by the bipolar cascade-ARROW laser of the present invention yields marked SNR improvement over other lasers. It is important to note that the bipolar cascade-ARROW laser is a general technique for enhancing the laser properties of interest in any current or anticipated application without regard to any particular growth, processing or material technology.

As previously described, the performance enhancements gained by the use of the bipolar cascade-ARROW laser are of importance in all areas in which edge-emitting diode semiconductor lasers are in use. The most pertinent applications at present would be digital and analog fiber optic links. High power laser arrays and free-space links would also benefit from the use of this invention.

Having described preferred embodiments of the invention, it will now become apparent to one of ordinary skill in the art that other embodiments incorporating their concepts may also be used. It is felt therefore that these embodiments should not be limited to disclosed embodiments but rather should be limited only by the spirit and scope of the appended claims. All publications and references cited herein are expressly incorporated herein by reference in their entirety.

What is claimed is:

1. A bipolar cascade-ARROW laser comprising:

a plurality of core regions;

at least one spacer disposed between each core region in the plurality of core regions with each of the at least one spacers being provided as a tunnel junction having a first material having an index of refraction which is higher than an index of refraction of a second material from which the plurality of core regions is provided;

anti-reflectors disposed against outermost ones of the plurality of core regions; and at least one quantum well disposed in each of the plurality of core regions.

2. The laser according to claim 1, wherein a width of each of the core regions corresponds to one half of a vertical wavelength in the second material.

3. The laser according to claim 1, wherein the first material comprises a material selected from the group consisting of InGaAsP.

4. The laser according to claim 2, wherein a vertical half wavelength in the second material is about 2.8 micrometers.

5. The laser according to claim 1, wherein the at least one quantum well comprises about 0.8 percent compressively strained InGaAsP with an emission wavelength of about 1.55 $\mu$m.

6. The laser according to claim 1, wherein a width of each of the spacer regions corresponds to one half of a vertical half wavelength in the first material.

7. The laser according to claim 6, wherein the vertical half wavelength in the first material is about 0.62 micrometers.

8. The laser according to claim 1, wherein the second material comprises InP.

9. The laser according to claim 1, wherein the at least one spacer comprises InGaAsP having a bandgap of about 1.2 $\mu$m.

10. The laser according to claim 1, wherein the anti-reflectors have a width corresponding to 2m+1, for m an integer, quarter vertical wavelengths in the first material.

11. The laser according to claim 1, wherein the anti-reflectors have a width corresponding to a quarter vertical wavelength in the second material.

12. A method of lasing, comprising:

providing a plurality of core regions;

forming at least one spacer disposed between each core region in the plurality of core regions with each of the at least one spacers being provided as a tunnel junction having a first material having an index of refraction which is higher than an index of refraction of a second material from which the plurality of core regions is provided;

forming anti-reflectors disposed against outermost ones of the plurality of core regions;

forming at least one quantum well disposed in each of the plurality of core regions so as to form a bipolar cascade ARROW laser; and energizing the bipolar cascade laser.

13. The method according to claim 12, wherein a width of each of the core regions corresponds to one half of a vertical wavelength in the second material.

14. The method according to claim 12, further including selecting the first material from InGaAsP having a bandgap of about 1.2$\mu$.

15. The method according to claim 12, wherein a width of each of the spacer regions corresponds to one half of a vertical wavelength in the first material.

16. The method according to claim 12, wherein the second material comprises InP.

17. The method according to claim 14, wherein a vertical half wavelength in the second material is about 2.8 micrometers.

18. The method according to claim 12, further including forming the at least one quantum well with about 0.8 percent compressively strained InGaAsP having an emission wavelength of about 1.55 $\mu$m.

19. The method according to claim 12, further including forming the anti-reflectors so as to have a width corresponding to 2m+1, for m an integer, quarter lateral wavelengths in the first material.

20. The method according to claim 12, further including forming the anti-reflectors so as to have a width corresponding to a quarter lateral wavelength in the second material.

* * * * *

UNITED STATES PATENT AND TRADEMARK OFFICE
CERTIFICATE OF CORRECTION

PATENT NO. : 6,587,492 B2
DATED : July 1, 2003
INVENTOR(S) : Steven G. Patterson It is certified that error appears in the above-identified patent and that said Letters Patent is hereby corrected as shown below:

Title page,
Item [57], ABSTRACT, line 2, delete "each the" and replace with -- each of the --.

Column 2,
Line 32, delete "region a" and replace with -- region, a --.
Line 43, delete "anti-guide the" and replace with -- anti-guide the --.
Line 45, delete "In this way the" and replace with -- In this way, the --.
Line 48, delete "resonator retain" and replace with -- resonator to retain --.

Column 3,
Line 24, delete "invention multiple" and replace with -- invention multiple --.

Column 5,
Line 5, delete "in variety" and replace with -- in a variety --.

Column 6,
Lines 5, 30 and 31, delete "cascade arrow" and replace with -- cascade-arrow --.

Signed and Sealed this

Seventh Day of September, 2004

JON W. DUDAS
*Director of the United States Patent and Trademark Office*